US010020003B2

United States Patent
Tu et al.

(10) Patent No.: US 10,020,003 B2
(45) Date of Patent: Jul. 10, 2018

(54) VOICE SIGNAL PROCESSING APPARATUS AND VOICE SIGNAL PROCESSING METHOD

(71) Applicant: Acer Incorporated, New Taipei (TW)

(72) Inventors: Po-Jen Tu, New Taipei (TW); Jia-Ren Chang, New Taipei (TW); Kai-Meng Tzeng, New Taipei (TW)

(73) Assignee: Acer Incorporated, New Taipei (TW)

( * ) Notice: Subject to any disclaimer, the term of this patent is extended or adjusted under 35 U.S.C. 154(b) by 2 days.

(21) Appl. No.: 15/457,104

(22) Filed: Mar. 13, 2017

(65) Prior Publication Data

US 2018/0166090 A1 Jun. 14, 2018

(30) Foreign Application Priority Data

Dec. 9, 2016 (TW) .............................. 105140854 A

(51) Int. Cl.

| G10L 19/14 | (2006.01) |
| G10L 21/02 | (2013.01) |
| G10L 21/0364 | (2013.01) |
| G10L 21/0232 | (2013.01) |
| G10L 21/038 | (2013.01) |

(52) U.S. Cl.
CPC ...... *G10L 21/0205* (2013.01); *G10L 21/0232* (2013.01); *G10L 21/038* (2013.01); *G10L 21/0364* (2013.01)

(58) Field of Classification Search
CPC . G10L 21/0324; G10L 19/008; G10L 19/167; G10L 21/038; G10L 21/0205; G10L 21/0232; G10L 21/0364
USPC .......................................................... 704/205
See application file for complete search history.

(56) References Cited

U.S. PATENT DOCUMENTS

| 2009/0220109 A1* | 9/2009 | Crockett .............. H03G 3/3089 |
| | | 381/107 |
| 2016/0197590 A1* | 7/2016 | Koppens ................ H03G 7/007 |
| | | 381/106 |
| 2016/0219391 A1* | 7/2016 | Ward ..................... G10L 19/008 |
| 2017/0048609 A1* | 2/2017 | Schnell ................ H04R 1/1083 |

FOREIGN PATENT DOCUMENTS

TW       1471856       2/2015

* cited by examiner

*Primary Examiner* — Jakieda Jackson
(74) *Attorney, Agent, or Firm* — J.C. Patents

(57) ABSTRACT

A voice signal processing apparatus and a voice signal processing method are provided. A loudness of an input voice signal is detected to obtain a reference loudness. Reference loudness gains corresponding to frequency bands are calculated according to the reference loudness and wide dynamic range compression curves corresponding to the frequency bands. Loudnesses of filter signals of the frequency bands are adjusted according to the reference loudness gains of the frequency bands.

10 Claims, 4 Drawing Sheets

VOICE SIGNAL PROCESSING APPARATUS AND VOICE SIGNAL PROCESSING METHOD

CROSS-REFERENCE TO RELATED APPLICATION

This application claims the priority benefit of Taiwan application serial no. 105140854, filed on Dec. 9, 2016. The entirety of the above-mentioned patent application is hereby incorporated by reference herein and made a part of this specification.

BACKGROUND OF THE INVENTION

Field of the Invention

The invention relates to a signal processing apparatus and more particularly relates to a voice signal processing apparatus and a voice signal processing method.

Description of Related Art

The multi-frequency band WDRC (wide dynamic range compression) technology is extensively used in the field of hearing aids. Wide dynamic range compression is mainly to improve the loudness gain for a voice signal with low loudness to facilitate recognition as well as reduce the loudness gain for a voice signal with high loudness to avoid generating a loud voice that causes discomfort. The general multi-frequency band WDRC is to process the voice signal of each frequency band independently, and the WDRC curve of each frequency band is determined by the hearing test subject to individual needs. When the WDRC processing is performed on an input voice signal, the loudness of the output voice signal of each frequency band is determined respectively by the corresponding wide dynamic range compression curve with reference to the loudness detection result of the input voice signal of each frequency band. Such processing can enhance the loudness of the output voice signal. However, if the loudness gain corresponding to the loudness of the noise signal is larger, the signal-to-noise ratio may drop and cause low recognition of the output voice signal.

SUMMARY OF THE INVENTION

The invention provides a voice signal processing apparatus and a voice signal processing method for effectively preventing drop of a signal-to-noise ratio of an output voice signal due to a multi-frequency band wide dynamic range compression process and significantly improving recognition of the output voice signal.

The voice signal processing apparatus of the invention includes a filtering part and a processing part. The filtering part receives an input voice signal and filters the input voice signal to generate a plurality of filter signals of different frequency bands. The processing part detects a loudness of the input voice signal to obtain a reference loudness, calculates reference loudness gains corresponding to the frequency bands according to the reference loudness and wide dynamic range compression curves corresponding to the frequency bands, multiplies the filter signals by the reference loudness gains corresponding to the filter signals to obtain a plurality of loudness adjusted filter signals corresponding to the frequency bands, and adds up the loudness adjusted filter signals to generate an output voice signal.

In an embodiment of the invention, the wide dynamic range compression curves are obtained by performing wide dynamic range compression processes corresponding to the frequency bands on a unit gain curve, and the processing part further calculates the reference loudness gains according to first output loudnesses corresponding to the reference loudnesses on the wide dynamic range compression curves corresponding to the frequency bands and a second output loudness corresponding to the reference loudness on the unit gain curve.

In an embodiment of the invention, the processing part further detects loudnesses of the filter signals to obtain a plurality of filter loudnesses, respectively calculates filtering loudness gains of the frequency bands according to the filter loudnesses and the wide dynamic range compression curves corresponding to the frequency bands, the reference loudness gain and the filtering loudness gain of each of the frequency bands are compared to respectively select a loudness gain that has a smaller gain value, and multiplies the selected loudness gains that have the smaller gain value by the corresponding filter signals of the frequency bands to obtain the loudness adjusted filter signals.

In an embodiment of the invention, the wide dynamic range compression curves are obtained by performing wide dynamic range compression processes corresponding to the frequency bands on a unit gain curve, and the processing part further calculates the filtering loudness gains corresponding to the frequency bands according to first output loudnesses corresponding to the filter loudness of the frequency bands on the wide dynamic range compression curves of the frequency bands and second output loudnesses corresponding to the filter loudnesses of the frequency bands on the unit gain curve.

In an embodiment of the invention, the filtering part performs bandpass filtering on the input voice signal.

The voice signal processing method of the invention includes the following. An input voice signal is received. The input voice signal is filtered to generate a plurality of filter signals of different frequency bands. A loudness of the input voice signal is detected to obtain a reference loudness. Reference loudness gains corresponding to the frequency bands are calculated according to the reference loudness and wide dynamic range compression curves corresponding to the frequency bands. The filter signals are multiplied by the reference loudness gains corresponding to the filter signals to obtain a plurality of loudness adjusted filter signals corresponding to the frequency bands. The loudness adjusted filter signals are added up to generate an output voice signal.

In an embodiment of the invention, the wide dynamic range compression curves are obtained by performing wide dynamic range compression processes corresponding to the frequency bands on a unit gain curve, and the reference loudness gains are calculated and obtained according to first output loudnesses corresponding to the reference loudness on the wide dynamic range compression curves corresponding to the frequency bands and a second output loudness corresponding to the reference loudness on the unit gain curve.

In an embodiment of the invention, the voice signal processing method further includes the following. Loudnesses of the filter signals are detected to obtain a plurality of filter loudnesses. Filtering loudness gains of the frequency bands are respectively calculated according to the filter loudnesses and the wide dynamic range compression curves corresponding to the frequency bands. The reference loudness gain and the filtering loudness gain of each of the frequency bands are compared to respectively select a loudness gain that has a smaller gain value. The selected loudness gains having the smaller gain value are multiplied by the corresponding filter signals of the frequency bands to obtain the loudness adjusted filter signals.

In an embodiment of the invention, the wide dynamic range compression curves are obtained by performing wide dynamic range compression processes corresponding to the frequency bands on a unit gain curve, and the filtering loudness gains corresponding to the frequency bands are calculated and obtained according to first output loudnesses corresponding to the filter loudnesses of the frequency bands on the wide dynamic range compression curves of the frequency bands and second output loudnesses corresponding to the filter loudnesses of the frequency bands on the unit gain curve.

In an embodiment of the invention, the voice signal processing method includes performing bandpass filtering on the input voice signal.

Based on the above, according to the embodiments of the invention, the reference loudness is obtained by detecting the loudness of the input voice signal, the reference loudness gain corresponding to each frequency band is calculated according to the reference loudness and the wide dynamic range compression curve corresponding to each frequency band, and the loudness of the filter signal of each frequency band is adjusted according to the reference loudness gain of each frequency band, so as to prevent drop of the signal-to-noise ratio of the output voice signal and thereby significantly improve recognition of the output voice signal.

To make the aforementioned and other features and advantages of the invention more comprehensible, several embodiments accompanied with figures are described in detail as follows.

BRIEF DESCRIPTION OF THE DRAWINGS

The accompanying drawings are included to provide a further understanding of the invention, and are incorporated in and constitute a part of this specification. The drawings illustrate exemplary embodiments of the invention and, together with the description, serve to explain the principles of the invention.

DESCRIPTION OF THE EMBODIMENTS

Figure 1:
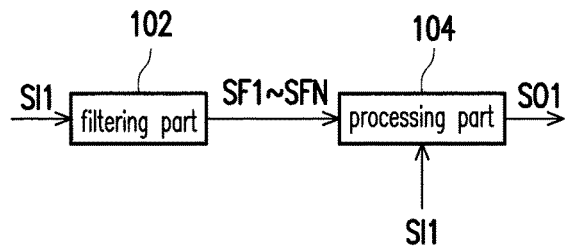
FIG. 1 is a schematic diagram of a voice signal processing apparatus according to an embodiment of the invention.

FIG. 1 is a schematic diagram of a voice signal processing apparatus according to an embodiment of the invention. Please refer to FIG. 1. The voice signal processing apparatus includes a filtering part 102 and a processing part 104. The filtering part 102 is coupled to the processing part 104, wherein the filtering part 102 may be implemented by a bandpass filter and the processing part 104 may be implemented by a central processing unit, for example. Nevertheless, the invention is not limited thereto.

The filtering part 102 filters an input voice signal SI1, so as to generate a plurality of filter signals SF1 to SFN of different frequency bands to be provided to the processing part 104, wherein N is a positive integer greater than 1. The processing part 104 may detect a loudness of the input voice signal SI1 and use the loudness of the input voice signal SI1 as a reference loudness. The processing part 104 may calculate reference loudness gains corresponding to the frequency bands according to the reference loudness and wide dynamic range compression curves corresponding to the frequency bands, wherein the wide dynamic range compression curves corresponding to the frequency bands are curves obtained by respectively wide dynamic range compression processes corresponding to the frequency bands on a unit gain curve. Each of the wide dynamic range compression curves of the frequency bands is determined by a hearing test subject to individual needs, and the wide dynamic range compression curves corresponding to different frequency bands may be different. Specifically, the processing part 104 may calculate a loudness gain according to an output loudness corresponding to a reference loudness on the wide dynamic range compression curve corresponding to a frequency band and an output loudness corresponding to the reference loudness on the unit gain curve corresponding to the frequency band. The processing part 104 may multiply the filter signals of the frequency bands by the reference loudness gains corresponding to the filter signals of the frequency bands so as to obtain a plurality of loudness adjusted filter signals corresponding to the different frequency bands, and add up the loudness adjusted filter signals to generate an output voice signal SO1. By calculating the reference loudness gains of the frequency bands according to the reference loudness, excessive loudness gains corresponding to noise signals are prevented so as to reduce a signal-to-noise ratio of the output voice signal SO1.

Figure 2:
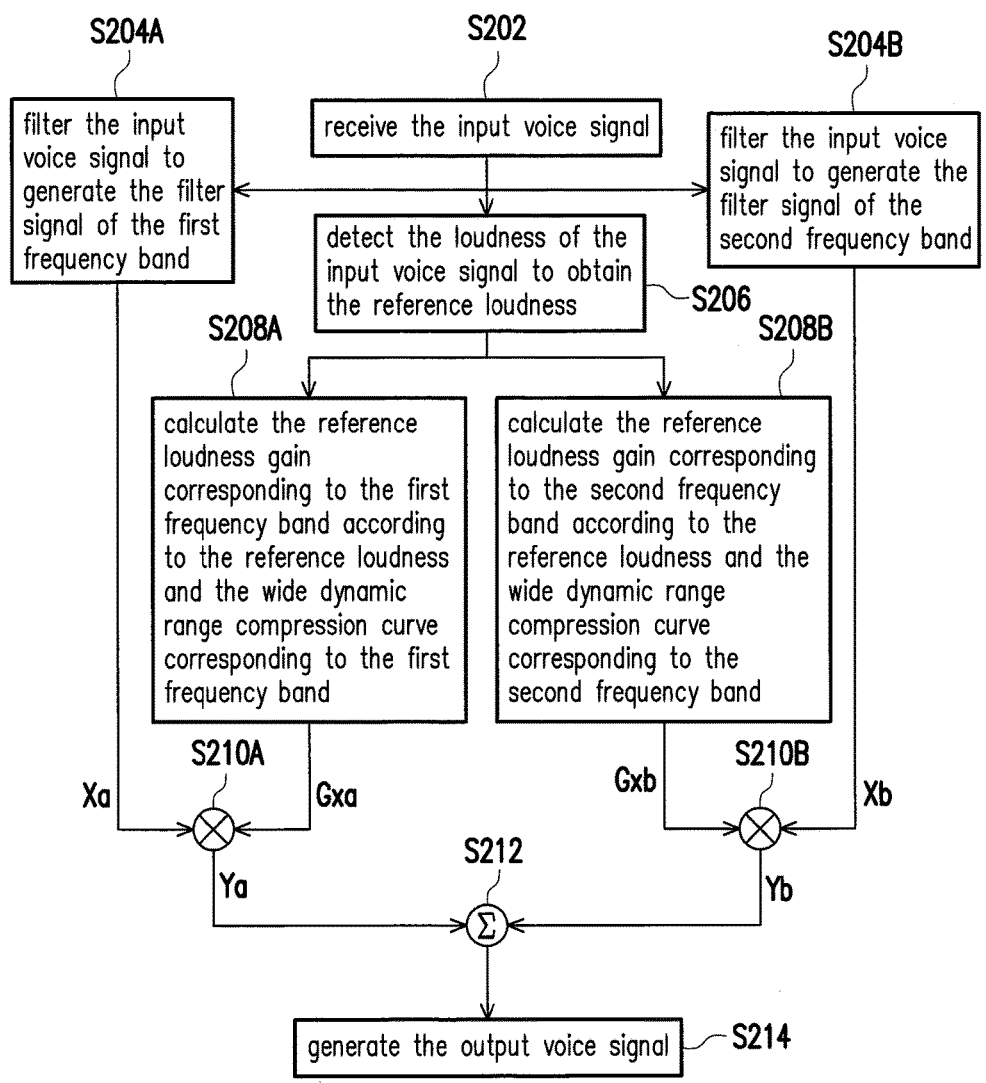
FIG. 2 is a flowchart of a voice signal processing method according to an embodiment of the invention.

For example, FIG. 2 is a flowchart of a voice signal processing method according to an embodiment of the invention. Please refer to FIG. 2. The voice signal processing method of this embodiment includes steps as follows. First, the input voice signal is received (Step S202) and the filtering part 102 filters the input voice signal SI1, so as to generate a filter signal Xa of a first frequency band (Step S204A) and a filter signal Xb of a second frequency band (Step S204B). The processing part 104 may detect the loudness of the input voice signal SI1 to obtain the reference loudness (Step S206). It should be noted that, in this embodiment, generation of filter signals of two different frequency bands is described as an example. However, the invention is not limited thereto. In other embodiments, the filtering part 102 may generate more filter signals of different frequency bands. In Step S208A, the processing part 104 may calculate a reference loudness gain corresponding to the first frequency band according to the reference loudness and a wide dynamic range compression curve corresponding to the first frequency band. In Step S208B, the processing part 104 may calculate a reference loudness gain corresponding to the second frequency band according to the reference loudness and a wide dynamic range compression curve corresponding to the second frequency band.

Figure 3:
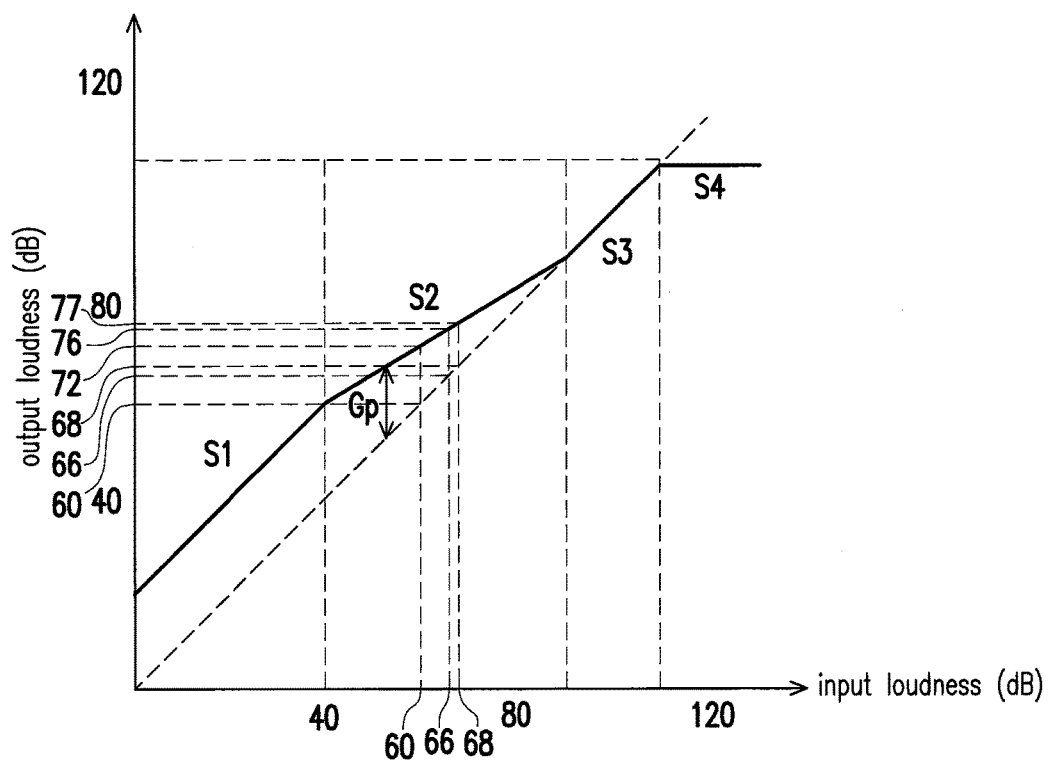
FIG. 3 is a chart showing a wide dynamic range compression curve according to an embodiment of the invention.

For example, FIG. 3 is a chart showing the wide dynamic range compression curve according to an embodiment of the invention. It is assumed that the wide dynamic range compression curves corresponding to the first frequency band and the second frequency band are as shown in FIG. 3, but the invention is not limited thereto. In other embodiments, the wide dynamic range compression curves corresponding to the first frequency band and the second frequency band may be different from the wide dynamic range compression curve of FIG. 3, and the first frequency band and the second frequency band may correspond to different wide dynamic range compression curves. The wide dynamic range compression curve of the embodiment of FIG. 3 is divided into a plurality of sections S1 to S4, wherein the section S1 is a linear section, the section S2 is a compressed section, the section S3 is a linear section, and the section S4 is a limited section. In addition, the dotted line is the unit gain curve. That is, the input loudness of the signal is equal to the output loudness. The section S1 may be used to amplify weak voices for people having hearing problems, and the section S2 may be used to adjust the dynamic range of the user's range of hearing. In the section S3, the wide dynamic range compression curve and the unit gain curve overlap, because people having hearing problems have the same saturated sound pressure as normal people, which does not need to be amplified. The section S4 is for limiting the loudness of the output voice signal SO1, so as to prevent hearing loss.

It is assumed that the input loudness of the input voice signal SI1 is 68 dB, and a voice signal of the input voice signal SI1 is mainly distributed in the first frequency band and the input loudness thereof is 66 dB (that is, the loudness of the filter signal Xa is 66 dB). A noise signal of the input voice signal SI1 is mainly distributed in the second frequency band and the input loudness thereof is 60 dB (that is, the loudness of the filter signal Xb is 60 dB). The processing part 104 may calculate a loudness gain Gp according to an output loudness corresponding to a reference loudness on a wide dynamic range compression curve corresponding to a frequency band and the output loudness corresponding to the reference loudness on a unit gain curve. For example, in this embodiment, the input loudness of the input voice signal SI1 serves as the reference loudness (68 dB), the output loudness corresponding to the reference loudness on the wide dynamic range compression curve is 77 dB, and the corresponding output loudness on the unit gain curve is 68. Thus, the reference loudness gains Gxa and Gxb are 77−68=9 dB.

After calculating the reference loudness gains Gxa and Gxb of the first frequency band and the second frequency band, the processing part 104 may multiply the filter signal Xa of the first frequency band by the reference loudness gain corresponding to the filter signal Xb of the first frequency band so as to obtain a loudness adjusted filter signal Ya corresponding to the first frequency band (Step S210A), and the loudness of the loudness adjusted filter signal Ya is equal to 66+9=75 dB. Accordingly, in Step S210B, it is calculated that the loudness of a loudness adjusted filter signal Yb is 60+9=69 dB. Thereafter, the processing part 104 may add up the loudness adjusted filter signals Ya and Yb (Step S212) to generate the output voice signal SO1 (Step S214). According to the voice signal processing method of this embodiment, the signal-to-noise ratio of the output voice signal SO1 is 75−69=6 dB. In the case of using the conventional wide dynamic range compression process, that is, the processing part 104 calculates output loudnesses of the filter signals of frequency bands according to the wide dynamic range compression curves of frequency bands and the input loudnesses of the filter signals of frequency bands and then adds up the filter signals of frequency bands, which has undergone the wide dynamic range compression process, to obtain the output voice signal, the obtained output voice signal would have a smaller signal-to-noise ratio than the output voice signal SO1 of this embodiment. For example, if the conventional wide dynamic range compression process is performed according to the wide dynamic range compression curve of FIG. 3, the output loudness (i.e., the loudness of the loudness adjusted filter signal Ya) corresponding to the input loudness (60 dB) of the filter signal Xa of the first frequency band is equal to 72 dB and the output loudness (i.e., the loudness of the loudness adjusted filter signal Yb) corresponding to the input loudness (66 dB) of the filter signal Xb of the second frequency band is equal to 76 dB. Accordingly, the signal-to-noise ratio of the output voice signal is 76−72=4 dB. It is clear that the wide dynamic range compression process of this embodiment renders a higher signal-to-noise ratio.

Figure 4:
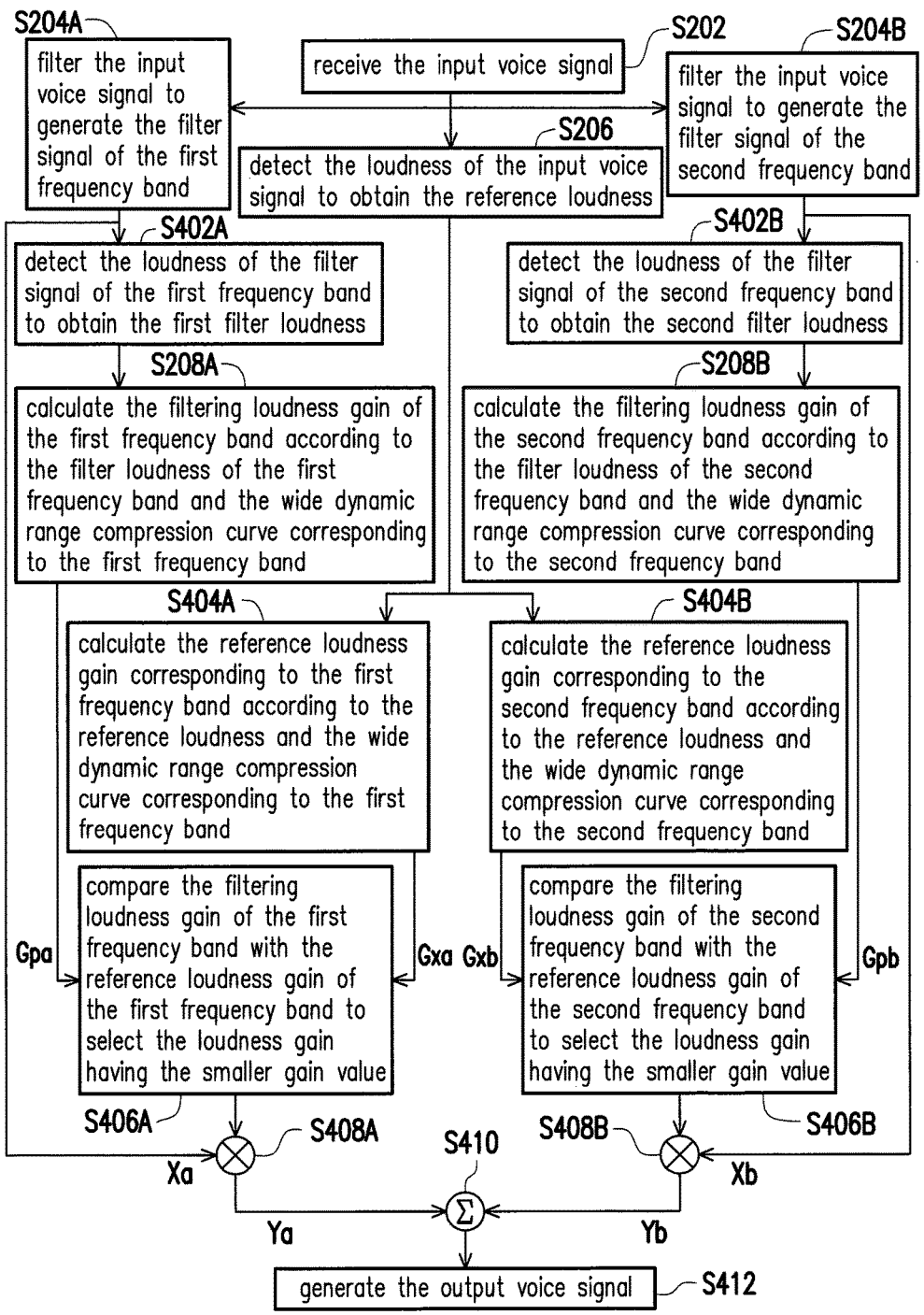
FIG. 4 is a flowchart of a voice signal processing method according to another embodiment of the invention.
Figure 5:
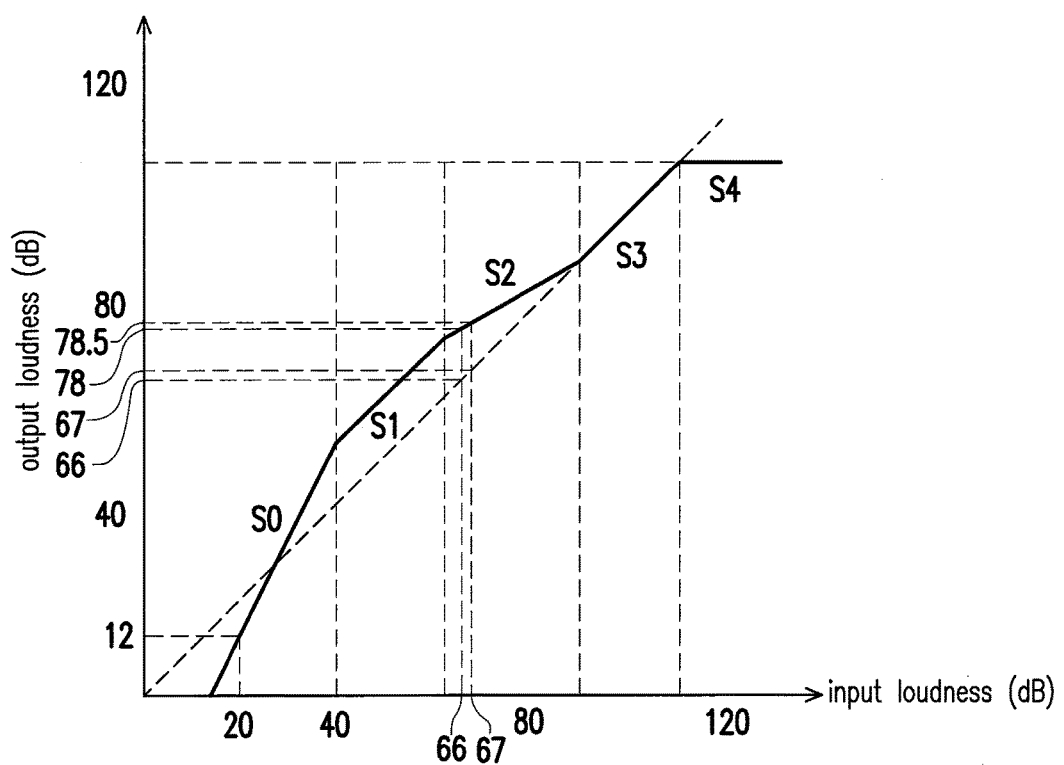
FIG. 5 is a chart showing a wide dynamic range compression curve according to another embodiment of the invention.

FIG. 4 is a flowchart of a voice signal processing method according to another embodiment of the invention. Please refer to FIG. 4. In this embodiment, it is assumed that the wide dynamic range compression curves corresponding to the first frequency band and the second frequency band are as shown in FIG. 5, but the invention is not limited thereto. In other embodiments, the wide dynamic range compression curves corresponding to the first frequency band and the second frequency band may be different from the wide dynamic range compression curve of FIG. 5, and the first frequency band and the second frequency band may correspond to different wide dynamic range compression curves. The wide dynamic range compression curve of the embodiment of FIG. 5 is divided into a plurality of sections S0 to S4, wherein the section S0 is an expanded section, the section S1 is a linear section, the section S2 is a compressed section, the section S3 is a linear section, and the section S4 is a limited section. In addition, the dotted line is the unit gain curve. That is, the input loudness of the signal is equal to the output loudness. When the noise signal is much smaller than the voice signal and falls in the section S0, the section S0 may be used to increase the signal-to-noise ratio. It should be noted that, in the embodiment of FIG. 4, generation of filter signals of two different frequency bands is described as an example. However, the invention is not limited thereto. In other embodiments, the filtering part 102 may generate more filter signals of different frequency bands.

As compared with the embodiment of FIG. 2, in this embodiment, the processing part 104 further detects the loudnesses of the filter signals Xa and Xb to obtain a first filter loudness and a second filter loudness (Steps S402A and 5402B), and calculates a filtering loudness gain Gpa of the first frequency band according to the first filter loudness and the wide dynamic range compression curve corresponding to the first frequency band (Step S404A) and calculates a filtering loudness gain Gpb of the second frequency band according to the second filter loudness and the wide dynamic range compression curve corresponding to the second frequency band (Step S404B), and then compares the filtering loudness gain Gpa of the first frequency band with the reference loudness gain Gxa of the first frequency band and compares the filtering loudness gain Gpb of the second frequency band with the reference loudness gain Gxb of the second frequency band to respectively select the loudness gain having a smaller gain value (Steps S406A and S406B). Then, the processing part 104 respectively multiplies the selected loudness gain having the smaller gain value with the filter signals of the corresponding frequency bands to obtain the loudness adjusted filter signal Ya of the first frequency band and the loudness adjusted filter signal Yb of the second frequency band. Thereafter, the processing part 104 adds up the loudness adjusted filter signal Ya and the loudness adjusted filter signal Yb (Step S410) to generate the output voice signal SO1 (Step S412). The reference loudness gain and the filtering loudness gain of each frequency band are compared to respectively select the loudness gain having the smaller gain value for the loudness gain calculation of the filter signal, when the wide dynamic range compression curve of FIG. 5 is used, the loudness gain of the filter signal is not calculated all based on the reference loudness gain of each frequency band, and thus drop of the signal-to-noise ratio of the output voice signal SO1 is prevented.

For example, it is assumed that the input loudness of the input voice signal SI1 in this case is 67 dB, and the voice signal of the input voice signal SI1 is mainly distributed in the first frequency band and the input loudness thereof is 66 dB (that is, the loudness of the filter signal Xa is 66 dB). The noise signal of the input voice signal SI1 is mainly distributed in the second frequency band and the input loudness thereof is 20 dB (that is, the loudness of the filter signal Xb is 20 dB). Like the embodiment described above, the processing part 104 may calculate a loudness gain according to a output loudness corresponding to a reference loudness on a wide dynamic range compression curve corresponding to a frequency band and the output loudness corresponding to the reference loudness on a unit gain curve. For example, in this embodiment, the input loudness of the input voice signal SI1 serves as the reference loudness (67 dB), the output loudness corresponding to the reference loudness on the wide dynamic range compression curve is 78.5, and the corresponding output loudness on the unit gain curve is 67. Thus, the reference loudness gains Gxa and Gxb are 78.5−67=11.5 dB. Moreover, in this embodiment, the processing part 104 further calculates the filtering loudness gains corresponding to frequency bands according to first output loudnesses corresponding to the filter loudnesses of frequency bands on the wide dynamic range compression curves corresponding to frequency bands and second output loudnesses corresponding to the filter loudnesses of frequency bands on the unit gain curve. For example, in this embodiment, the loudness of the filter signal Xa of the first frequency band is 66 dB and the corresponding output loudness thereof on the wide dynamic range compression curve is 78 dB. That is, the filtering loudness gain of the filter signal Xa of the first frequency band is 78−66=12 dB. In addition, in this embodiment, the loudness of the filter signal Xa of the second frequency band is 20 dB and the corresponding output loudness thereof on the wide dynamic range compression curve is 12 dB. That is, the filtering loudness gain of the filter signal Xa of the first frequency band is 12−20=−8 dB.

The processing part 104 may compare the filtering loudness gain (12 dB) of the first frequency band with the reference loudness gain (11.5 dB) of the first frequency band and select the reference loudness gain (11.5 dB) that has the smaller loudness gain value to be multiplied by the filter signal Xa of the first frequency band, so that the loudness of the loudness adjusted filter signal Ya of the first frequency band is equal to 66+11.5=77.5 dB. Likewise, the processing part 104 may compare the filtering loudness gain (−8 dB) of the second frequency band with the reference loudness gain (11.5 dB) of the second frequency band and select the filtering loudness gain (−8 dB) of the filter signal Xb of the second frequency band that has the smaller loudness gain value to be multiplied by the filter signal Xb of the second frequency band, so that the loudness of the loudness adjusted filter signal Yb of the second frequency band is equal to 20−8=12 dB. Accordingly, the signal-to-noise ratio of the output voice signal SO1 is 77.5−12=65.5 dB, which is well maintained. If the reference loudness gain Gxb (11.5 dB) of the second frequency band is directly multiplied by the filter signal Xb of the second frequency band, as illustrated in the embodiment of FIG. 2, it is obtained that the loudness of the loudness adjusted filter signal Yb of the second frequency band is equal to 20+11.5=31.5 dB. Accordingly, the signal-to-noise ratio of the output voice signal SO1 is 77.5−31.5=36 dB. Apparently, when the wide dynamic range compression curve of FIG. 5 is used, the wide dynamic range compression process of this embodiment renders a higher signal-to-noise ratio.

Besides, if the filter signal Xb of the second frequency band falls in the section S2 in this embodiment, that is, the noise signal falls in the section S2, since the filter loudnesses of the filter signal Xa of the first frequency band and the filter signal Xb of the second frequency band are necessarily smaller than the loudness of the input voice signal SI1, the filtering loudness gains of the filter signal Xa of the first frequency band and the filter signal Xb of the second frequency band are larger than the reference loudness gains Gxa and Gxb of the first frequency band and the second frequency band respectively. In other words, in Step S406A and Step S406B, the reference loudness gains Gxa and Gxb are respectively selected to be respectively multiplied by the filter signal Xa and the filter signal Xb so as to achieve effects similar to those of the embodiment of FIG. 2, such that the output voice signal SO1 has a higher signal-to-noise ratio. Adjustment of the loudness of the filter signal performed based on the reference loudness gain has been explained in the embodiment of FIG. 2 and thus is not repeated hereinafter. It is known from the above that by performing the voice signal processing method of this embodiment, the output voice signal has a high signal-to-noise ratio regardless of the loudness of the noise signal.

It should be noted that, in the embodiment of FIG. 4, generation of filter signals of two different frequency bands is described as an example. However, the invention is not limited thereto. In other embodiments, the filtering part 102 may generate more filter signals of different frequency bands. Furthermore, although the dB value is used to indicate the loudness in the above embodiments, the processing part 104 does not necessarily perform the calculation based on the dB values and may directly use voltage values corresponding to the loudnesses for calculation to save computing resources.

In conclusion, according to the embodiments of the invention, the reference loudness is obtained by detecting the loudness of the input voice signal, the reference loudness gains corresponding to frequency bands are calculated according to the reference loudness and the wide dynamic range compression curves corresponding to the frequency bands, and the loudnesses of the filter signals of the frequency bands are adjusted according to the reference loudness gains of the frequency bands, so as to prevent drop of the signal-to-noise ratio of the output voice signal and thereby significantly improve recognition of the output voice signal. In some embodiments, the reference loudness gains and the filtering loudness gains of the frequency bands may also be compared, so as to respectively select the loudness gain having the smaller gain value for performing loudness gain calculation of the filter signals, such that drop of the signal-to-noise ratio of the output voice signal may be prevented.

It will be apparent to those skilled in the art that various modifications and variations can be made to the disclosed embodiments without departing from the scope or spirit of the invention. In view of the foregoing, it is intended that the invention covers modifications and variations provided that they fall within the scope of the following claims and their equivalents.

What is claimed is:

1. A voice signal processing apparatus, comprising:
   an input voice signal filter receiving an input voice signal and filtering the input voice signal to generate a plurality of filter signals of different frequency bands; and a processor detecting a loudness of the input voice signal to obtain a reference loudness, calculating reference loudness gains corresponding to the frequency bands according to the reference loudness and wide dynamic range compression curves corresponding to the frequency bands, multiplying the filter signals by the reference loudness gains corresponding to the filter signals to obtain a plurality of loudness adjusted filter signals corresponding to the frequency bands, and adding up the loudness adjusted filter signals to generate an output voice signal.

2. The voice signal processing apparatus according to claim 1, wherein the wide dynamic range compression curves are obtained by performing wide dynamic range compression processes corresponding to the frequency bands on a unit gain curve, and the processor further calculates the reference loudness gains according to first output loudnesses corresponding to the reference loudness on the wide dynamic range compression curves corresponding to the frequency bands and a second output loudness corresponding to the reference loudness on the unit gain curve.

3. The voice signal processing apparatus according to claim 1, wherein the processor further detects loudnesses of the filter signals to obtain a plurality of filter loudnesses, respectively calculates filtering loudness gains of the frequency bands according to the filter loudnesses and the wide dynamic range compression curves corresponding to the frequency bands, the reference loudness gain and the filtering loudness gain of each of the frequency bands are compared to respectively select a loudness gain that has a smaller gain value, and multiplies the selected loudness gains that have the smaller gain value by the corresponding filter signals of the frequency bands to obtain the loudness adjusted filter signals.

4. The voice signal processing apparatus according to claim 3, wherein the wide dynamic range compression curves are obtained by performing wide dynamic range compression processes corresponding to the frequency bands on a unit gain curve, and the processor further calculates the filtering loudness gains corresponding to the frequency bands according to first output loudnesses corresponding to the filter loudnesses of the frequency bands on the wide dynamic range compression curves of the frequency bands and second output loudnesses corresponding to the filter loudnesses of the frequency bands on the unit gain curve.

5. The voice signal processing apparatus according to claim 1, wherein the input voice signal filter performs bandpass filtering on the input voice signal.

6. A voice signal processing method, comprising:
receiving an input voice signal;
filtering the input voice signal to generate a plurality of filter signals of different frequency bands;

detecting a loudness of the input voice signal to obtain a reference loudness;
calculating reference loudness gains corresponding to the frequency bands according to the reference loudness and wide dynamic range compression curves corresponding to the frequency bands;
multiplying the filter signals by the reference loudness gains corresponding to the filter signals to obtain a plurality of loudness adjusted filter signals corresponding to the frequency bands; and
adding up the loudness adjusted filter signals to generate an output voice signal.

7. The voice signal processing method according to claim 6, wherein the wide dynamic range compression curves are obtained by performing wide dynamic range compression processes corresponding to the frequency bands on a unit gain curve, and the reference loudness gains are calculated and obtained according to first output loudnesses corresponding to the reference loudness on the wide dynamic range compression curves corresponding to the frequency bands and a second output loudness corresponding to the reference loudness on the unit gain curve.

8. The voice signal processing method according to claim 6, further comprising:
detecting loudnesses of the filter signals to obtain a plurality of filter loudneses;
respectively calculating filtering loudness gains of the frequency bands according to the filter loudnesses and the wide dynamic range compression curves corresponding to the frequency bands;
the reference loudness gain and the filtering loudness gain of each of the frequency bands are compared to respectively select a loudness gain that has a smaller gain value; and
multiplying the selected loudness gains that have the smaller gain value by the corresponding filter signals of the frequency bands to obtain the loudness adjusted filter signals.

9. The voice signal processing method according to claim 8, wherein the wide dynamic range compression curves are obtained by performing wide dynamic range compression processes corresponding to the frequency bands on a unit gain curve, and the filtering loudness gains corresponding to the frequency bands are calculated and obtained according to first output loudnesses corresponding to the filter loudnesses of the frequency bands on the wide dynamic range compression curves of the frequency bands and second output loudnesses corresponding to the filter loudnesses of the frequency bands on the unit gain curve.

10. The voice signal processing method according to claim 6, comprising:
performing bandpass filtering on the input voice signal.

* * * * *